United States Patent [19]

Sheahan et al.

[11] 3,723,920

[45] Mar. 27, 1973

[54] CRYSTAL FILTER ASSEMBLY

[75] Inventors: Desmond F. Sheahan, San Carlos; George C. Callander, Palo Alto, both of Calif.

[73] Assignee: GTE Automatic Electric Laboratories Incorporated, Northlake, Ill.

[22] Filed: June 24, 1971

[21] Appl. No.: 156,275

[52] U.S. Cl. ........................333/72, 310/8.2, 310/9.8

[51] Int. Cl. ............................H03h 7/10, H03h 9/00

[58] Field of Search ............333/71, 72; 310/8.2, 9.8; 29/25.35

[56] References Cited

UNITED STATES PATENTS

| | | | |
|---|---|---|---|
| 2,859,416 | 11/1958 | Niederman | 333/72 |
| 3,311,760 | 3/1967 | Durgin et al. | 310/8.2 X |
| 3,345,588 | 10/1967 | Chesney | 310/9.8 X |
| 3,596,212 | 7/1971 | Werner et al. | 333/7.2 |

OTHER PUBLICATIONS

"High Frequency Crystal Electromechanica Filler,+ by Nakazawa Proc. of the 16th Annual Symposium on Frequency Control, U.S. Army Signal R & D Laboratory, 27 April 1962, pps. 373–390

"High Frequency Crystal Mechanical Filters" by H. Yoda et al., Proc. of the 22nd Annual Symposium on Frequency Control, U.S. Army Electronics Command, 24 April 1956, pps. 188–205

*Primary Examiner*—Herman Karl Saalbach
*Assistant Examiner*—Saxfield Chatmon
*Attorney*—K. Mullerheim et al.

[57] ABSTRACT

In this filter, each one of two coupled resonators is formed on a different crystal wafer. Each wafer is accurately positioned with respect to one longitudinal groove in the periphery of a ceramic ring. The wafer is supported in the central opening in the ring with wires which are soldered to metalized areas of the ring and to resonator lead patterns on the wafer to form a resonator assembly. Each resonator is tuned to operate at a predetermined frequency by locating the associated resonator assembly in a masking jig with respect to the one groove on the ring to accurately align the resonator electrode patterns with holes in the jig. A metal film is evaporated onto a resonator electrode to adjust the resonant frequency of the associated resonator to be equal to the predetermined frequency. In a packaged filter the resonator assemblies and electrically conductive spacers are alternately stacked on a header having a pair of posts protruding therefrom that are located in longitudinal grooves in the ceramic rings and openings in the spacers for supporting the stacked elements. Extensions and tabs on the spacers are soldered to the alignment posts and metalized areas on the rings, respectively, to ground the resonators and spacers to the header. The spacer sandwiched between the rings provides isolation between the resonators on adjacent wafers. A discrete chip capacitor is connected to a resonator electrode and a metalized area on a ring which is grounded to the header. The resonator electrodes are also selectively interconnected and connected to insulated lead pins in the header to produce a filter structure. The packaged filter is hermetically sealed by cold welding a cover to the header.

17 Claims, 14 Drawing Figures

INVENTORS.
DESMOND F. SHEAHAN
GEORGE C. CALLANDER
BY
Russell A. Cannon
AGENT

INVENTORS
DESMOND F. SHEAHAN
GEORGE C. CALLANDER
BY
Russell Alonso
AGENT

INVENTORS.
DESMOND F. SHEAHAN
GEORGE C. CALLANDER

BY

Russell A. Cannon

AGENT

CRYSTAL FILTER ASSEMBLY

BACKGROUND OF THE INVENTION

This invention relates to crystal filters and more particularly to an improved crystal filter assembly and to the method of fabricating such a filter assembly.

Considerable work has been performed in recent years to perfect the theory and design of electrical filters comprising crystal wafers having resonators formed thereon. Each resonator comprises overlapping electrode patterns formed on opposite surfaces of a crystal body by vapor deposition. In early crystal filters each single or coupled resonator was formed on a separate AT-cut crystal wafer. The individual resonator wafers were connected by wires singly or back-to-back to a header and hermetically sealed each in a separate cover, see Proceedings of the 23rd Annual Symposium on Frequency Control, 1969, pp. 65–92. This method of mounting resonators makes it difficult to align a wafer for fine tuning a resonator by depositing more metal on the electrode patterns since the mounting wires are easily bent. This means that alignment of the patterns for tuning must be accomplished optically or by physically locating on the circumference of the wafer. The former method is expensive and the latter is difficult to accomplish. These packaged resonators were interconnected with discrete components such as is illustrated in U.S. Pat. No. 2,859,416 to form a structure having a desired filter characteristic. The resultant filter assembly may include several resonator packages and thus be relatively large and complex.

In an effort to reduce the size of the filter assembly and to facilitate fabrication thereof, monolithic crystal filters were made with all of the resonators formed on the same quartz body through which resonators are acoustically coupled. Monolithic crystal filters are described in the article "Theory and Design of the Monolithic Crystal Filter" by W. D. Beaver, Proceedings of the 21st Annual Symposium on Frequency Control, 1967, pp. 179–199. Although it would appear desirable to fabricate a complete filter network on a single slice of piezoelectric crystal, such filters have poor stopband performance because of undesirable coupling that exists between the resonators. Also, since all of the resonators for a particular filter are formed on the same crystal body, the number of parameters (such as electrode spacing, size, thickness, etc.) that must have values within specified limits to produce an acceptable resonator structure is greatly increased. This dictates that great care be taken in fabricating such filters since the whole resonator structure may have to be scrapped if one resonator is bad. It can be seen therefore that the unit production cost associated with fabricating acceptable monolithic resonator structures is high unless they are produced in very large quantities and with sophisticated and highly automated production equipment.

An object of this invention is the provision of an improved crystal filter assembly overcoming these disadvantages and wherein single and coupled resonators are formed on different crystal wafers.

Another object is the provision of an improved method of producing a crystal filter assembly.

Another object is the provision of an improved method of fine tuning a resonator.

DESCRIPTION OF THE DRAWINGS

This invention will be more clearly and fully understood from the following detailed description thereof taken in conjunction with the drawings where.

DESCRIPTION OF PREFERRED EMBODIMENT

Figure 1:
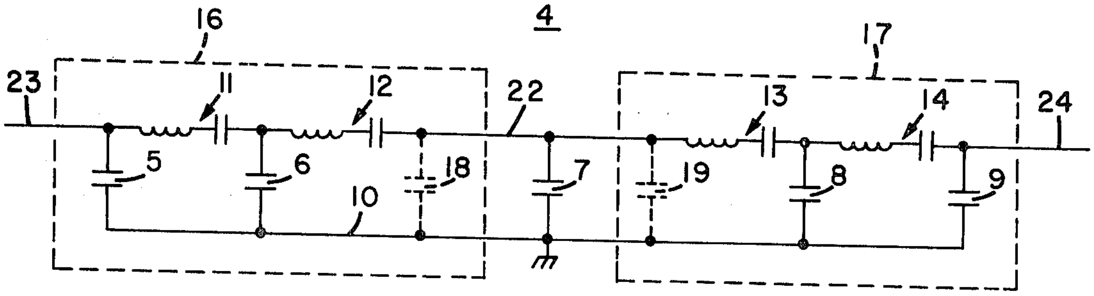
FIG. 1 is a schematic circuit diagram of a bandpass filter.

Consider now the bandpass filter network 4 that is illustrated in schematic form in FIG. 1. Filter 4 comprises shunt capacitors 5–9 that are connected between the grounded line 10 and terminals of the series resonant circuits 11–14. Bandpass filter 4 may be derived, by way of example, from a lowpass filter by the techniques outlined in the article "Single Sideband Filters for Short Haul Systems" by D. F. Sheahan, Proceedings of the 1971 International IEEE Conference on Systems, Networks and Computers, Oaxtepec, Mexico, January 1971, pp. 744–748.

Figure 2:
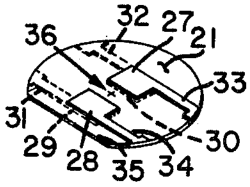
FIG. 2 is a perspective view of a coupled resonator comprising a crystal wafer.

Each of the circuits 16 and 17 in FIG. 1, including the associated capacitors 18 and 19 which are shown in broken lines, represents the electrical equivalent circuit of an acoustically coupled resonator such as the one illustrated in FIG. 2 which comprises a quartz crystal wafer 21 and electrode patterns formed thereon. The capacitors 7, 18 and 19 in FIG. 1 are effectively connected in parallel so that the net capacitance between line 22 and ground is the sum of the individual capacitances thereof. Since the capacitances of the resonator capacitors 18 and 19 are small, they are ignored in many instances. In practice, however, capacitor 7 may be selected to have a smaller value of capacitance than that dictated by the filter design in order to compensate for the additional capacitance provided by capacitors 18 and 19. Thus, it is seen that filter 4 can be realized with the two coupled resonator circuits 16 and 17 and a shunt capacitor 7 connected therebetween.

The design of coupled resonators is described in prior art publications including the aforementioned Beaver article and U.S. Pat. No. 3,564,463 and does not per se constitute applicants' invention. Since the acoustically coupled resonators 16 and 17 are similar, only the structure comprising coupled resonator 16 will be referenced and described in detail. Referring now to FIG. 2, coupled resonator 16 comprises conductive electrode patterns formed on the opposite major faces or sides of wafer 21. The patterns comprise the rectangular electrodes 27, 28 and 29, 30 on opposite sides of the wafer and leads 31–34. The wafer is a thin disc of AT-cut quartz crystal, for example, having one edge or flat 35 cut along a particular direction in the XZ plane of the quartz. The frequency of each coupled resonator and its electrical equivalent circuit in FIG. 1 is a function of the size, shape and spacing of the electrodes 27–30, inclusive. The patterns are formed on wafer 21 by evaporating gold through a metal mask (not shown) onto opposite sides of the wafer. The mask, and thus the patterns, are accurately located with respect to the center point 36 of the wafer and the flat 35. In practice, conductive patterns are simultaneously evaporated onto a plurality of crystal wafers. Since it is not possible to accurately control the resonant frequency of each resonator during this operation, the thickness of the evaporated metal during this batch processing is adjusted to cause the resonant frequency of each resonator to be higher than the desired value. Each resonator is subsequently fine tuned, as described more fully hereinafter, by evaporating additional metal onto an electrode previously laid down until the resonant frequency thereof is lowered to the desired value.

Figure 3:
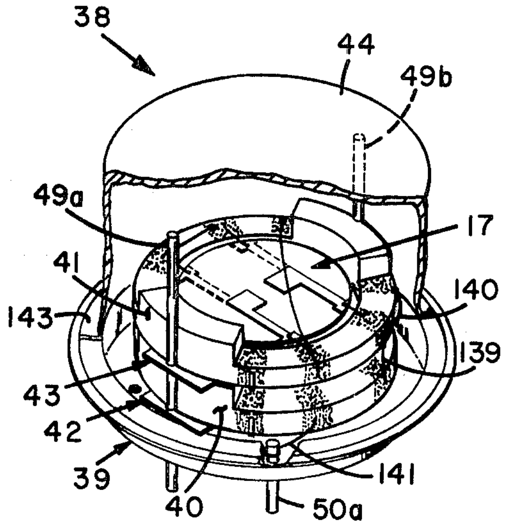
FIG. 3 is a perspective view of one side of a filter assembly embodying this invention and which is accurately modeled by the electrical equivalent circuit in FIG. 1.
Figure 4:
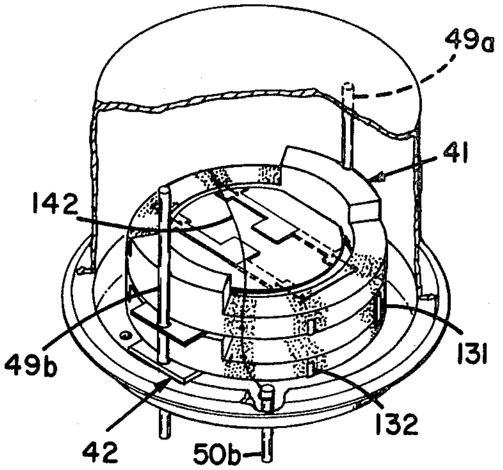
FIG. 4 is a perspective view of the other side of the filter assembly in FIG. 3.

The filter assembly 38 embodying this invention and illustrated in FIGS. 3 and 4 has a transfer function that is accurately modeled by the electrical equivalent circuit in FIG. 1. Filter assembly 38 comprises header 39; mounting rings 40 and 41 that support the coupled resonators 16 and 17, respectively, which are formed on separate crystal wafers; spacers 42 and 43; and cover 44.

Figure 5:
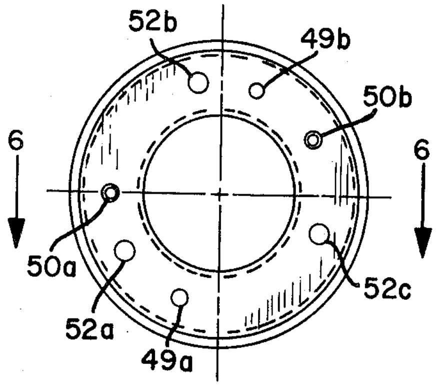
FIG. 5 is a bottom view of the header.
Figure 6:
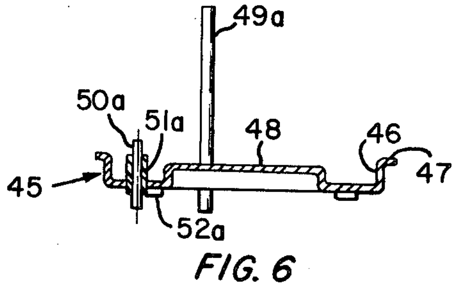
FIG. 6 is a section view taken along lines 6—6 in FIG. 5.

Referring now to FIGS. 5 and 6, the header 39 comprises a preformed copper disc or base 45 having a cylindrical groove 46 formed therein between radial mounting flange 47 and central plate section 48. The surfaces of flange 47 and plate 48 are flat and in parallel planes.

Pairs of posts **49*a* and 49*b* and beaded pins 50*a* and 50*b* that extend through the wall of disc 45 are located on the same radius in groove 46. The posts, which may be made of stainless steel, are rigidly secured in the wall of disc 45 and are electrically connected thereto such as by brazing. As illustrated in FIG. 6, the glass bead 51*a* is sealed to lead pin 50*a* and disc 45 to rigidly secure the pin in and electrically insulate it from the disc. Three depressions 52*a*, 52*b* and 52*c*, which are equally circumferencially spaced around groove 46 on the same radius as the posts, are formed in the wall of disc 45. The depressions operate as stand-offs which maintain the portions of disc 45 adjacent the pins spaced from a printed circuit board (not shown) on which filter 38 is mounted. After the pins and the posts are secured in disc 45, the header is nickel plated to prepare the surface of flange 47 for later cold welding to the cover 44**.

Figure 7:
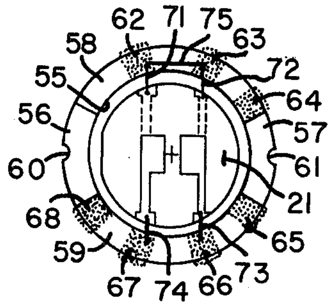
FIG. 7 is a top view of a resonator assembly with the wafer in FIG. 2 mounted in the central opening of a ceramic mounting ring.
Figure 8:
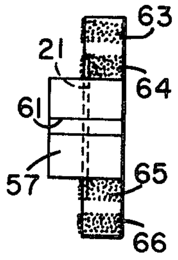
FIG. 8 is a side view of the resonator assembly in FIG. 7.

Since the mounting rings 40 and 41 are identical, only ring 40 will be referenced and described in detail. Referring now to FIGS. 7 and 8, ring 40 is preferably made of a ceramic such as alumina which is pressed into the desired shape and heated in a furnace to remove the binder therefrom. The center hole 55 in the ring has a diameter that is larger than that of wafer 21. The ring has a pair of shoulder sections 56 and 57 which are diametrically spaced apart on the same side thereof and raised above the thinner sections 58 and 59. Longitudinal grooves 60 and 61 are formed in the peripheries of sections 56 and 57, respectively. The outer diameter of the ring and positions of the longitudinal grooves therein are such that the ring slides smoothly between the header posts 49a and 49b when the latter are located in the grooves. A plurality of metallic electrodes 62–68, inclusive, are formed on one side of the circumference of sections 58 and 59. The electrodes 62–68 are formed by painting an electrically conductive silver paint such as is used in thick film circuits, for example, onto the ring and heating the painted ring to remove the binder from the paint. Lead wires 71–74 are then soldered to the associated conductive patterns, 62, 63, 66 and 67, on the ring. A wire 75 is also soldered to the ring electrodes 62 and 63 to provide the ground connection line 10 that is shown in FIG. 1. Alternatively, a single electrode (not shown) may be formed on the surface of the ring in place of the two electrodes 62 and 63 and both of the lead wires 71 and 72 connected thereto.

Figure 9:
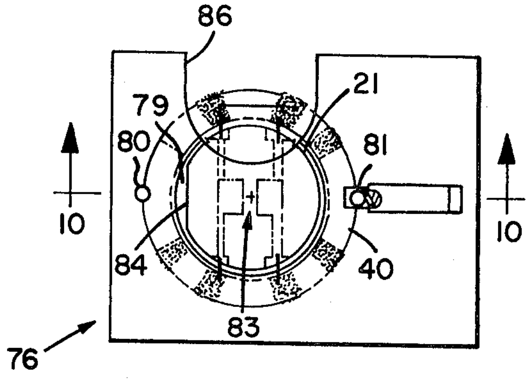
FIG. 9 is a top view of a holding jig for mounting the wafer in the ring, the latter two elements being shown in phantom lines.
Figure 10:
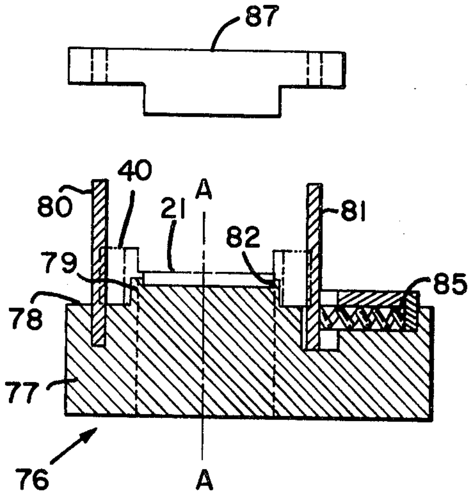
FIG. 10 is a section view taken along lines 10—10 in FIG. 9.

The electroded wafer 21 comprising coupled resonator 16 is mounted in ceramic ring 40 with the aid of holding fixture of jig 76, see FIGS. 9 and 10. Jig 76 comprises base 77 having a flat surface 78 thereon, annular flange 79 extending from the surface 78, and a pair of posts 80 and 81. The inner diameter of the opening 82 of flange 79 is accurately sized to align the center point 36 of the crystal wafer with the longitudinal axis A—A of the flange and has a keying flat 84 therein for orienting wafer 21 in the flange. The depth of the opening 82 in the flange is slightly less than the thickness of wafer 21. The height of the flange is slightly less than the thicknesses of the thinner sections 58 and 59 of the ring. Post 80 is rigidly secured in base 77 with respect to the center point 83 of flange 82 and the axis A—A. Thus, the ring is approximately centered on flange 79 when the former is loaded in jig 76 with the longitudinal groove 60 securely pressed against post 80. Post 81 slides in base 77 and is spring loaded by spring 85. The longitudinal axes of posts 80 and 81 and the axis A—A are aligned in the same plane containing the longitudinal axis of spring 85. The spacing between posts 80 and 81, when the spring is in its extended position, is less than the diameter on which grooves 60 and 61 in FIG. 7 are located. The base 77 and flange 79 have a cut-out section 86 in one side thereof.

The ceramic ring 40 is loaded into jig 76 by moving post 81 to allow the ring to slip over flange 79 with the reference post 80 in groove 60 and shoulders 56 and 57 away from the surface 78. Post 81 is then released into groove 61 to press the ring and groove 60 against post 80 to securely locate the ring on jig 76. Wafer 21 is then placed in the opening 82 of flange 79 with lead patterns 33 and 34 under the associated wires 73 and 74, lead patterns 31 and 32 over the associated wires 71 and 72, and the wafer flat 35 contacting the flat 84 on jig 76. The center point 36 of wafer 21 is now accurately positioned in ring 40 with respect to groove 60 by mechanically locating on the circumference of the wafer. A cap 87 is slid over the posts 80 and 81 to hold the wafer in place when the jig is inverted and the wires 71–74 are soldered to the associated leads 31–34. The cut-out section 86 of the jig base and flange provides an open space for soldering the wires 71 and 72 to the associated leads 31 and 32 on the underside of wafer 21. Since the wafer is accurately located in the ring with respect to the longitudinal groove 60, alignment of the wafer and resonators hereinafter for tuning, testing and assembly may be done with respect to this groove. This greatly simplifies fabrication of the filter assembly shown in FIGS. 3 and 4 as is described more fully hereinafter and eliminates the need for sophisticated optical equipment and locating with respect to the wafer which is a delicate object.

Figure 11:
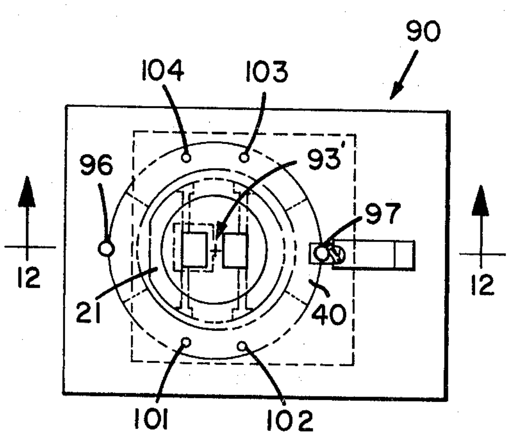
FIG. 11 is a top view of a masking jig for fine tuning the resonant frequency of a resonator with a resonator assembly shown in phantom lines.
Figure 12:
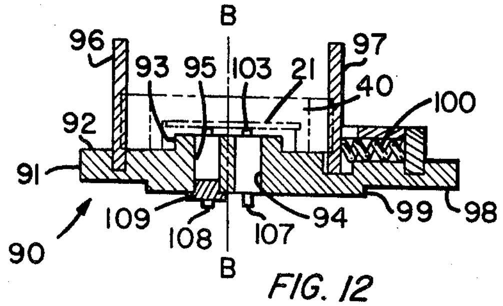
FIG. 12 is a section view taken along lines 12—12 in FIG. 11.

In accordance with this invention, the resonators are fine tuned with the aid of a masking jig 90, see FIGS. 11 and 12, while the crystal wafer 21 supporting resonator 16 is mounted in ring 40. The wafer and ring are also shown in phantom in FIGS. 11 and 12. Jig 90 is similar to jig 76 and comprises base 91 having a flat top surface 92, cylindrical flange 93 extending from the surface 92, a pair of rectangular openings 94 and 95 extending through the jig parallel to the axis B—B thereof, and a pair of posts 96 and 97. The bottom surface 98 of base 91 is milled to form a rectangular section 99 therein. Post 96 is rigidly secured in base 91 with respect to the center point 93′ of flange 93 and the axis B—B as was post 80 in jig 76. Post 97 is also movably secured in base 91 and held under compression by spring 100 as was the other post 81 in jig 76. The ring 40, with wafer 21 mounted therein, is loaded into jig 90 as it was in jig 76 except that the shoulders 56 and 57 of the ring are now in contact with the surface 92. Spring loaded pin electrodes 101-104 are dielectrically mounted in the top of base 91, as viewed in FIG. 11, for contacting the electrodes 62, 63, 66 and 67, respectively, on ring 40. Pin electrodes 105–108 are rigidly dielectrically mounted on the bottom of base 91 and are electrically connected to the associated pins 101–104. The rectangular openings 94 and 95 in base 91 are the same size as the electrodes 27–30 on the wafer and are spaced the same distance from the axis B—B as were the openings in the pattern that was used in the batch processing to initially evaporate the metal electrode patterns onto the wafer. Thus, the electrodes 27 and 28 on one surface of the wafer (the center point 36 of the wafer being aligned with the aid of posts 80 and 96 and groove 60 with the center point 93′ and axis B—B) are aligned with the mask openings 94 and 95, respectively. The height of flange 93 is slightly less than the difference between the thicknesses of sections 57 and 58 of ring 40 for shadowing wafer 21 to permit evaporation of metal through the openings 94 and 95 only onto the associated electrodes 27 and 28. A plug 109 is selectively placed in hole 94 or 95 to block metal evaporated toward the holes from the associated electrode 27 or 28.

Figure 13:
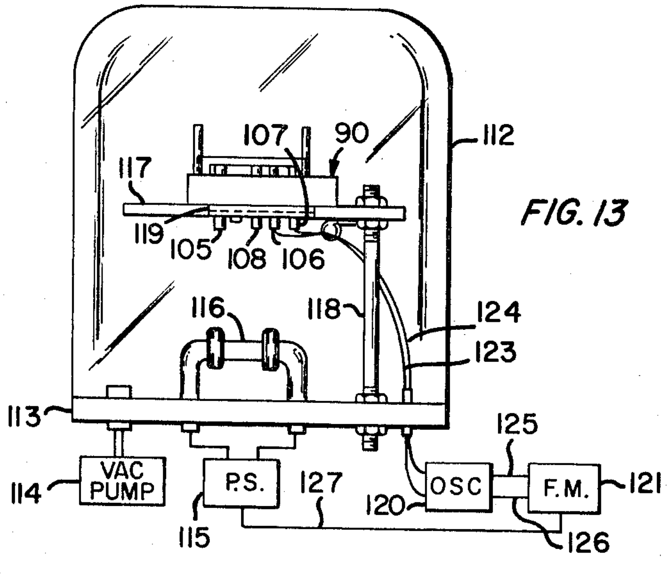
FIG. 13 is a plan view of equipment for evaporating metal onto a resonator electrode for fine tuning the resonator.

Referring now to FIG. 13, apparatus for fine tuning the resonant frequency of a resonator comprises a vacuum chamber including a bell jar 112 on platform 113; a vacuum pump 114 for evacuating the bell jar; a power source 115 connected to a heater filament 116 on which a gold wire is placed; a platform 117 supported by a rod 118 which is secured to the platform 113; an oscillator 120; and a frequency meter 121. The resonator assembly is mounted in jig 90 as illustrated in FIGS. 11 and 12 with plug 109 blocking the hole 95 for example. Jig 90 is then placed on platform 117 with flange 99 in the hole 119 in the platform. A first pair of terminals on oscillator 120 are connected through lines 123 and 124 to the pins 106 and 107, respectively, and thus to the associated spring loaded electrodes 102 and 103 and lead patterns 32 and 33. This connects the resonator formed by electrodes 27 and 30 as part of the frequency determining circuit of oscillator 120. A second pair of terminals on the oscillator are connected through lines 125 and 126 to frequency meter 121.

In operation, the chamber is evacuated, the oscillator and frequency meter are energized, and the operating frequency of the oscillator is monitored. Power from source 115 is then applied to filament 116 to vaporize the gold which migrates toward platform 117 and is deposited on electrode 27. This additional metal deposited on electrode 27 decreases the resonant frequency of the associated resonator and accordingly changes the operating frequency of the oscillator. When the operating frequency of the oscillator changes to a prescribed value, indicating that the resonant frequency of the resonator is at a predetermined value, frequency meter 121 produces an output signal on line 127 which shuts off power source 115. The other resonator on wafer 21 is fine tuned in a similar manner after placing the plug 109 in the opening 94 and connecting wires 123 and 124 to the other pins 105 and 108.

Figure 14:
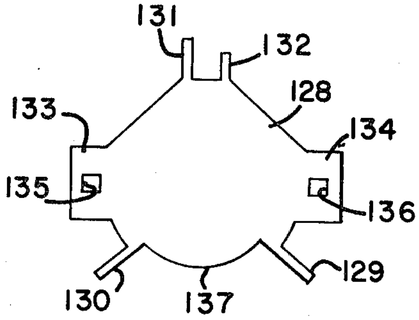
FIG. 14 is a top view of a spacer.

The spacers 42 and 43 in FIGS. 3 and 4 are identical. Only the spacer 42 will be referenced hereinafter therefore and described in detail. Referring now to FIG. 14, spacer 42 comprises a central body section 128, tabs 129–132, and a pair of extensions 133 and 134 each having an associated rectangularly shaped opening 135 and 136 extending therethrough. The spacers may, by way of example, be made of copper. The centers of the openings 135 and 136 are located on the same radius as, and have the same spacings as, post 49*a* and 49*b*. The spacer body 128 is shaped so that it overlaps the hole 55 in ring 40 and that the periphery thereof is within that of the ring when the openings 135 and 136 are aligned with the grooves 60 and 61, respectively, see FIG. 7. The length of tab 131 is greater than the difference between the thicknesses of the sections 56 and 58 of ring 40. The lengths of tabs 129, 130 and 132 are approximately equal to the thickness of the ring sections 58. The cutout section 137 between tabs 129 and 130 is formed on the spacer body to separate the periphery thereof from the electrodes 66 and 67 on ring 40 when the spacer and ring are stacked with longitudinal grooves 60, 61 and the associated apertures 135, 136 in alignment.

The filter package illustrated in FIGS. 3 and 4 is assembled by stacking spacer 42 on the header with the posts 49a and 49b in the holes 135 and 136, respectively, of the spacer and the tabs 131 and 132 facing into the paper in FIG. 3. Ring 40 is then stacked on the header with the posts *49a* and *49b* in the grooves 60 and 61, respectively, and the electrodes 62 and 63 also facing into the paper in FIG. 3. In a similar manner spacer 43 and ring 41 are stacked on the header in alignment with the posts *49a* and *49b*. The extensions 133 and 134 of both of the spacers are preferably soldered to the associated posts *49a* and *49b* at the apertures in the former to ground the spacers to the header. The grounded spacer 43 provides radio frequency shielding between adjacent coupled resonators and via the tabs 131 and 132 they provide a means of getting a ground connection from one ceramic ring to another as is described more fully hereinafter.

The tabs 129 and 130 on each spacer are bent upward (as viewed in FIG. 3) and soldered to the electrodes 65 and 68, respectively, of the adjacent ring. Similarly, the tabs 131 and 132 are bent downward and upward, respectively, (as viewed in FIG. 4) and soldered to the electrodes 62 and 63, respectively, of the adjacent rings. A wire 139 (see FIG. 3) is soldered to the electrodes 66 of rings 40 and 41 to form the line 22 which interconnects the resonators 16 and 17 in FIG. 1. A chip capacitor 140 (see FIG. 3) which corresponds to the associated capacitor 7 in FIG. 1 is soldered to the electrodes 65 and 66 on ring 41. A wire 141 is soldered between the electrode 67 on ring 40 and pin 50a so that the latter corresponds to the filter terminal 23 in FIG. 1. A wire 142 is also soldered between the electrode 67 on ring 41 (see FIG. 3) and the other pin *50b* in the header (see FIG. 4) so that this pin corresponds to the other filter terminal 24 in FIG. 1. The wire 142 may be soldered to the floating electrode 64 on ring 41 in order to restrict movement of this wire. The wire 142 is bent up in the air where it passes over the wafer in ring 41 to prevent its contacting the electrodes on the wafer. The cover 44 has a flange 143 that is cold welded to header flange 47 to hermetically seal the packaged filter.

There are many advantages obtained through the use of this invention. A bandpass filter may comprise four or more coupled resonators. In accordance with this invention, each coupled resonator is formed on a different crystal wafer which is mounted in an associated ceramic ring. Each resonator is then individually tested and fine tuned. If one of the resonators is defective it can be identified prior to fabrication of a complete filter. It is then only necessary to scrap the one coupled resonator and wafer. This greatly reduces the cost of manufacturing crystal filters since a single component part may now be scrapped rather than all of the resonators in the filter. This invention also facilitates the manufacture of filters having different response characteristics. The parts such as the header 39, ceramic rings 40, wafers 21, spacers 42 and cover 44 that are used to construct any filter are the same. It is only necessary to change the conductive patterns on the wafers to produce a filter having a different frequency response characteristic. This means that common jigging may be used for making different filters by using appropriate mask inserts (not shown) in the center of jig 90. This greatly simplifies the manufacture of filters. By way of example, a filter having a steeper skirt selectivity is obtained merely by stacking more spacers and resonator assemblies onto the header and making the appropriate connections thereto. Also, no elaborate alignment is required for tuning each crystal.

Although this invention was described in relation to a preferred embodiment thereof, changes, modifications and improvements therein will be obvious to one skilled in the art without departing from the spirit of the invention. By way of example, the ceramic ring 40 may be a rectangular frame having a similarly shaped hole therein. The crystal wafer 21 may also have a rectangular or other shape. Also, the hole 55 in ring 40 may be a bore in one end thereof. This would necessitate only a slight change in the shape of the ring and minor modification of the tooling required to secure the wafer in the ring. Although the wires are stated to be connected to electrodes by soldering, they also can be connected thereto by other means such as ultrasonic bonding. Jig 90 is shown as including a plug 109 which is manually placed in one of the holes 94 or 95 in the masking jig. This operation of masking one of the resonator electrodes of a coupled resonator may be accomplished automatically by relative movement of an apertured overlay between the filament 116 and the base 99 of jig 90 in platform 117 to expose the holes 94 and 95 one at a time. The relative movement of the overlay may also automatically connect the correct one of the electrode pairs 106, 107 and 105, 108 to the oscillator 120. The scope of this invention is therefore defined by the appended claims rather than by the preceding description of the best mode for practicing the invention.

What is claimed is:

1. A filter assembly comprising, in combination, a header having a base with a pair of posts rigidly secured therein and a pair of electrical lead pins dielectrically supported therein and extending therethrough;

a plurality of resonator assemblies, each resonator assembly comprising a dielectric frame having an opening therethrough, having a pair of grooves in the periphery thereof with the same relative spacing as said posts, and having a plurality of metallic electrodes spaced apart on the surface thereof adjacent the opening therein, a piezoelectric crystal body having a pair of opposing major faces, said crystal body being smaller than the opening in said frame, a conductive electrode pattern formed on each of said major faces of said crystal body, said patterns comprising overlapping body patterns and lead patterns connected to the body patterns, said body patterns and crystal body together forming an acoustic resonator, and first means electrically connecting said lead patterns to associated metallic electrodes for supporting said crystal body in the opening in said frame;

said resonator assemblies being stacked on said header with said posts in said grooves; and second means selectively electrically connecting said resonators together and to said header lead pins to form a network having a prescribed frequency response characteristic.

2. The filter assembly according to claim 1 including an electrically conductive spacer sandwiched between adjacent resonator assemblies, said spacer having a body section between electrode body patterns on adjacent crystal bodies for providing isolation therebetween, having a pair of openings therein with the same relative spacing as said posts, and being stacked on said header with said posts in said spacer openings.

3. The filter assembly according to claim 2 including means for dielectrically spacing said spacer from said crystal bodies, said second connecting means including third means electrically connecting at least one spacer to one of said posts.

4. The filter assembly according to claim 3 wherein said dielectric spacing means comprises at least one raised section on the surface of said frame supporting said metallic electrodes.

5. The filter assembly according to claim 4 wherein said frames are dielectric rings each having a central opening therein, having a pair of longitudinal grooves in the circumference thereof, and having a raised position in the one end thereof that supports said metallic electrodes, said metallic electrodes being continuously formed on the one end and circumference of said ring; wherein said crystal bodies are wafers; and wherein said first connecting means comprises wires selectively electrically connected between metallic electrodes on said ring and lead patterns on said wafer when said wafer is located in the central opening in said ring.

6. The filter assembly according to claim 5 wherein each spacer comprises a plurality of tabs extending from said spacer body and having the same relative spacing as metallic electrodes on said rings, some of said tabs being electrically connected to metallic electrodes on the circumference of one adjacent ring, other of said tabs being electrically connected to metallic electrodes on the circumference of the other adjacent ring.

7. The filter assembly according to claim 6 including a cover over said stacked resonator assemblies and spacers, said cover being secured to said header base for hermetically sealing said filter assembly.

8. The filter assembly according to claim 7 wherein said second connecting means comprises a chip capacitor.

9. The filter assembly according to claim 8 wherein one of said spacer tabs is connected to one of said metallic electrodes that is connected to a lead pattern for grounding one of said resonators.

10. The filter assembly according to claim 9 for mounting on a circuit board, said filter assembly including a plurality of protrusions in the header base extending away from said stacked resonator assemblies and spacers for spacing said header base from the circuit board adjacent the header lead pins.

11. A filter assembly comprising, in combination, a header having a base with a pair of posts rigidly secured therein and a pair of electrical lead pins dielectrically supported therein;

a plurality of stackable resonator assemblies, each resonator assembly comprising a dielectric frame having a first opening therein, having second and third openings therethrough with the same relative spacing as said posts, and having a plurality of metallic electrodes spaced apart on the surface thereof adjacent the first opening therein, a piezoelectric crystal body having a pair of opposing major faces, said crystal body being smaller than the first opening in said frame, a conductive electrode pattern formed on each of said major faces of said crystal body, said electrode patterns comprising overlapping body patterns and lead patterns connected to the body patterns, said body patterns and crystal body together forming an acoustic resonator, and first means electrically connecting said lead patterns to associated metallic electrodes for supporting said crystal body in the first opening in said frame;

said resonator assemblies being stacked on said header with said posts in associated second and third openings; and second means selectively electrically connecting said resonators together and to said header lead pins to form a network having a prescribed frequency response characteristic.

12. The filter assembly according to claim 11 wherein the body patterns are aligned in the first opening with respect to the second opening.

13. A stackable resonator assembly for use in a stacked crystal filter assembly comprising a dielectric frame having a pair of essentially parallel faces, having first and second openings in said frame faces, and having a plurality of metallic electrodes spaced apart on the frame face adjacent the first opening therein, a piezoelectric crystal body having a pair of opposing major faces, being smaller than the first opening, and being aligned in the first opening with respect to the second opening, a conductive electrode pattern formed on each of said major faces of said crystal body, said electrode patterns comprising overlapping body patterns with lead patterns connected to the body patterns, said electrode body patterns and crystal body together forming an acoustic resonator, and means electrically connecting said lead patterns to associated metallic electrodes for supporting said crystal body in the first opening with respect to the second opening.

14. The resonator assembly according to claim 13 including a third opening in said frame, said second and third openings extending through the frame faces.

15. The resonator assembly according to claim 14 wherein the body patterns are aligned in the first opening with respect to the second opening.

16. The resonator assembly according to claim 15 wherein said second and third openings are grooves in the periphery of said frame.

17. The resonator assembly according to claim 16 wherein said frame is a dielectric ring having a central opening therethrough and a pair of longitudinal grooves that are diagonally spaced apart in the periphery thereof; and wherein said crystal body is a wafer that is aligned in the central opening with respect to one of said grooves.

* * * * *